(12) United States Patent
Yang et al.

(10) Patent No.: US 9,741,772 B2
(45) Date of Patent: Aug. 22, 2017

(54) DISPLAY DEVICE COMPRISING BENDING SENSOR

(71) Applicant: LG Display Co., Ltd., Seoul (KR)

(72) Inventors: HeeSeok Yang, Gyeonggi-do (KR); DongYoon Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/977,994

(22) Filed: Dec. 22, 2015

(65) Prior Publication Data

US 2016/0190216 A1  Jun. 30, 2016

(30) Foreign Application Priority Data

Dec. 26, 2014 (KR) ........................ 10-2014-0191063
Aug. 28, 2015 (KR) ........................ 10-2015-0121967

(51) Int. Cl.
| | | |
|---|---|---|
| *H01L 27/32* | (2006.01) | |
| *G01B 7/16* | (2006.01) | |
| *G01L 1/20* | (2006.01) | |
| *G02F 1/1333* | (2006.01) | |
| *G02F 1/1362* | (2006.01) | |
| *H01L 51/00* | (2006.01) | |
| *H01L 51/52* | (2006.01) | |

(52) U.S. Cl.
CPC ............ *H01L 27/3225* (2013.01); *G01B 7/18* (2013.01); *G01L 1/20* (2013.01); *G02F 1/133305* (2013.01); *G02F 1/136286* (2013.01); *H01L 27/3276* (2013.01); *H01L 51/0097* (2013.01); *H01L 51/52* (2013.01); *G02F 2001/133388* (2013.01); *G02F 2201/122* (2013.01)

(58) Field of Classification Search
CPC .................................................. H01L 27/3225
See application file for complete search history.

(56) References Cited

U.S. PATENT DOCUMENTS

| | | | |
|---|---|---|---|
| 2007/0019143 A1* | 1/2007 | Chen ................ | G02F 1/136286 349/139 |
| 2012/0256720 A1 | 10/2012 | Byun et al. | |
| 2014/0217373 A1* | 8/2014 | Youn .................. | H01L 23/4985 257/40 |
| 2015/0091016 A1* | 4/2015 | Chen .................... | G09G 3/3225 257/72 |
| 2015/0192481 A1* | 7/2015 | Nguyen .................. | G01L 1/22 345/206 |

FOREIGN PATENT DOCUMENTS

| | | | |
|---|---|---|---|
| KR | 2014-0048007 A | | 4/2014 |
| KR | 1020140048007 | * | 4/2014 |

OTHER PUBLICATIONS

Extended European Search Report dated Apr. 29, 2016, for corresponding European Patent Application No. 15202450.1.
Communication dated Apr. 24, 2017 from the European Patent Office in counterpart European application No. 15450.1.

* cited by examiner

*Primary Examiner* — Matthew Reames
(74) *Attorney, Agent, or Firm* — Morgan, Lewis & Bockius LLP

(57) ABSTRACT

A display device including a bending sensor is provided. A display device including a bending sensor may include a flexible substrate including a display area and a bezel area surrounding the display area; and the bending sensor including a curved unit disposed in the bezel area and in which an electric change occurs when the flexible substrate is bent, and a detection unit detecting bending information by sensing the electric change.

20 Claims, 14 Drawing Sheets

DISPLAY DEVICE COMPRISING BENDING SENSOR

CROSS-REFERENCE TO RELATED APPLICATIONS

This application claims the priority of Korean Patent Application No. 10-2014-0191063 filed on Dec. 26, 2014 and the priority of Korean Patent Application No. 10-2015-0121967 filed on Aug. 28, 2015, in the Korean Intellectual Property Office, the disclosure of which are incorporated herein by reference.

BACKGROUND OF THE INVENTION

Field of the Invention

The present disclosure relates to a display device including a bending sensor, and more particularly, to a display device including a bending sensor having a curved unit in which an electric change occurs when a flexible substrate is bent, and a detection unit which is configured to sense the electric change and detect bending information.

Description of the Related Art

A flexible display device is manufactured to be able to display images even when it is bent like a paper by forming a display unit, wirings, and the like on a substrate formed of a material having flexibility such as plastic. In recent years, the flexible display device has received attention as a next-generation display device. The flexible display device has been applied to various fields including personal portable devices as well as computer monitors and TVs. Further, there have been conducted studies on the flexible display device having a reduced volume and weight with a large display area.

Meanwhile, there has been a demand for sensing a degree of a user's bending or folding of the flexible display device. When the user bends or folds the flexible display device, images of the flexible display device may be distorted. Therefore, it is very important to sense a degree of bending or folding of the flexible display device and correct images displayed on the flexible display device accordingly. Accordingly, there have been conducted studies on a method for manufacturing the flexible display device by attaching a separately manufactured bending sensor to the flexible display device. However, since the bending sensor is manufactured separately from the flexible display device, the total manufacturing cost may be increased. Further, since the separate bending sensor is attached to the flexible display device, thickness of the flexible display device may be increased. Therefore, such a technique of separately attaching the bending sensor to the flexible display device does not conform to the recent trend of providing a slim display device.

SUMMARY

Accordingly, the present invention is directed to a display device having a bending sensor that substantially obviates one or more of the problems due to limitations and disadvantages of the related art.

An object of the present invention is to provide a display device including a bending sensor.

Another object of the present invention is to provide a bending sensor that is manufactured during a manufacturing process of the display device in order to solve the problems occurring when it is manufactured separately from a flexible display device.

Another object of the present invention is to provide a display device including a bending sensor which can be formed together with a thin film transistor or a display element of the display device during a manufacturing process of the thin film transistor or the display element.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises a flexible substrate including a display area and a bezel area surrounding the display area; and a bending sensor including a curved unit disposed in the bezel area and in which an electric change occurs when the flexible substrate is bent, and a detection unit detecting bending information by sensing the electric change.

The curved unit may include wirings respectively extended in different directions in order to disperse a force applied during bending.

The curved unit may include two or more electric wires having a plurality of diamond shape wires connected to each other in a column, and the two or more electric wires may be parallel to each other.

The two or more electric wires may be disposed such that the diamond shape wires cross each other in a zigzag pattern.

The curved unit may include two or more electric wires having a plurality of circular shape wires connected to each other in a column, and the two or more electric wires may be parallel to each other.

The curved unit may include a first curved unit disposed on one side of a neutral plane which is not applied with a stress during bending since a force is canceled, and a second curved unit disposed on the opposite side of the neutral plane. One of the first curved unit and the second curved unit may be configured to be applied with a tensile force and the other one may be configured to be applied with a compressive force when the curved unit is bent.

The display device may further comprise a first insulating layer disposed between the first curved unit and the second curved unit; and a second insulating layer disposed on the second curved unit. The neutral plane may be in the first insulating layer.

The display device may further comprise a first insulating layer disposed on the first curved unit; and a second insulating layer disposed on the second curved unit and having thickness different from that of the first insulating layer. The first curved unit may be disposed on one side of the flexible substrate and the second curved unit may be disposed on the opposite side facing the one side, and the first curved unit and the second curved unit may be on the same layer.

The display device may further comprise a first insulating layer disposed on one side of the flexible substrate and on the opposite side facing the one side, disposed on the first curved unit, and disposed under the second curved unit; and a second insulating layer disposed on the second curved unit. The first curved unit may be disposed on one side of the flexible substrate and the second curved unit may be disposed on the opposite side facing the one side, and the first curved unit and the second curved unit may be on different layers.

The bending sensor may further include a wiring part connecting the curved unit and the detection unit. The curved unit and the wiring part may be positioned on at least one side of the flexible substrate. The wiring part may be positioned in a non-bending area and the curved unit may be positioned in a bending area.

The bending area may include both a part of the bezel area and a part of the display area, or include a part of the bezel area but not the display area.

The detection unit may sense the electric change occurring in the curved unit during bending, compare the electric change with an electric change value depending on a bending direction and a bending angle stored in a memory, and calculate a bending direction and a bending angle of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
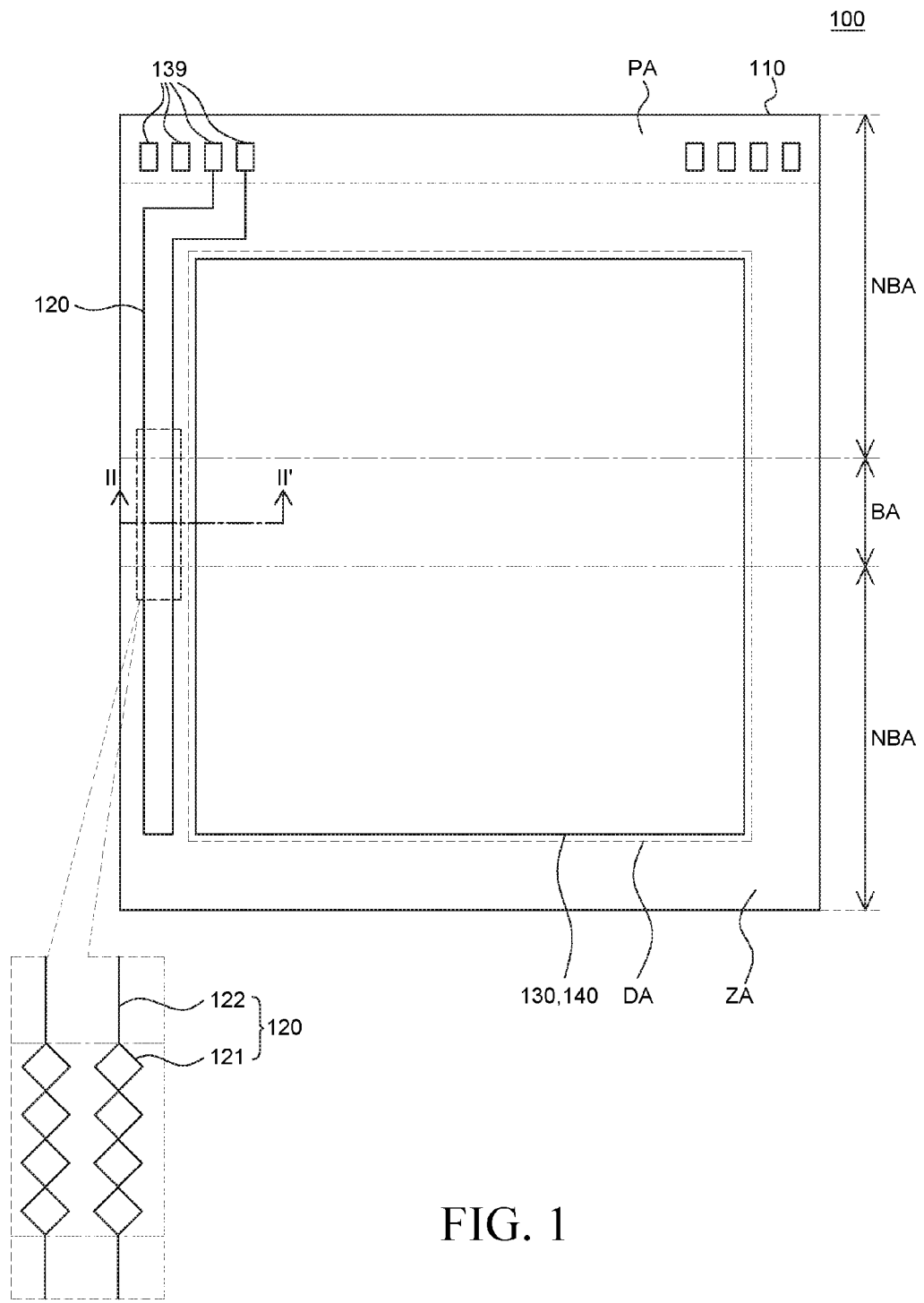
FIG. 1 is a plan view provided to describe a display device according to an example embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various example embodiments of the present disclosure will be described in detail with reference to the accompanying drawings.

Figure 2:
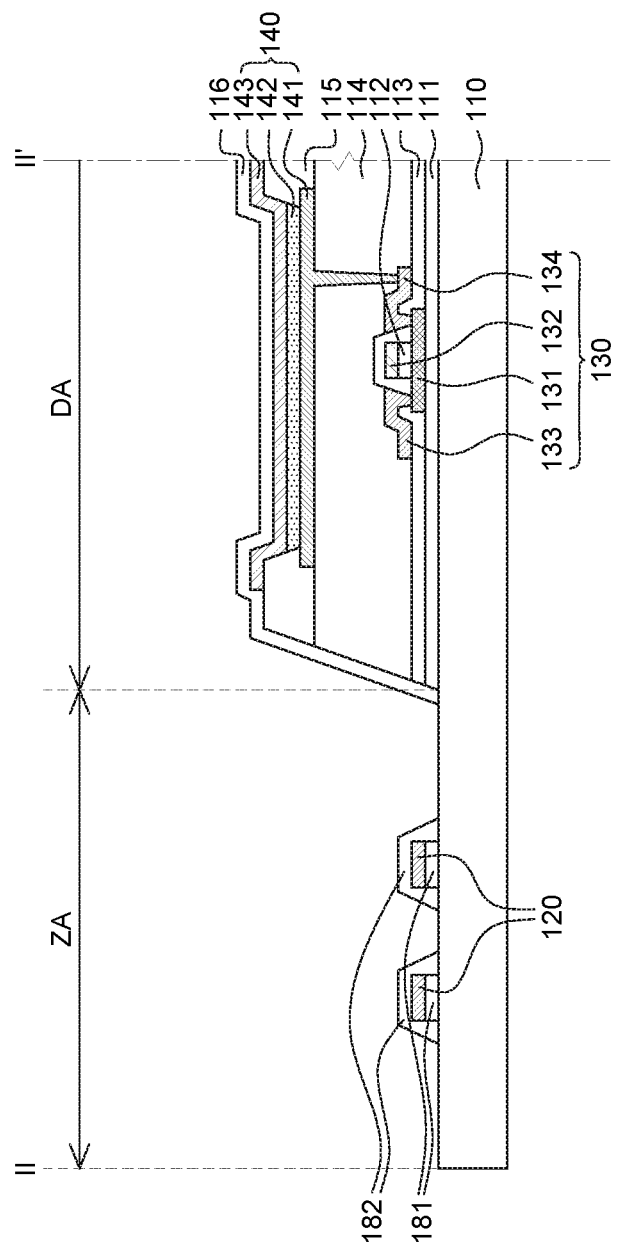
FIG. 2 is a cross-sectional view taken along a line II-II' of FIG. 1 and provided to describe the display device according to an example embodiment of the present disclosure.

FIG. 1 is a plan view provided to describe a display device according to an example embodiment of the present disclosure. FIG. 2 is a cross-sectional view taken along a line II-II' of FIG. 1 and provided to describe the display device according to an example embodiment of the present disclosure.

As illustrated in FIG. 1 and FIG. 2, a display device 100 includes a flexible substrate 110, a thin film transistor 130, a display element 140, and a bending sensor 120. For convenience in explanation, FIG. 2 illustrates only one thin film transistor 130 and only one display element 140.

The flexible substrate 110 is configured to support and protect various elements of the display device 100. The flexible substrate 110 may be formed of an insulating material having flexibility. For example, the flexible substrate 110 may be formed of plastic such as polyimide, but is not limited thereto.

The flexible substrate 110 includes a display area DA, a bezel area ZA surrounding the display area DA, and a pad area PA extended from one side of the bezel area ZA.

The display area DA is an area where an image is displayed on the display device 100. Therefore, the display element 140 and various driving elements for driving the display element 140 are disposed in the display area DA. For convenience in explanation, FIG. 2 illustrates only the driving thin film transistor 130 among various driving elements, but the present disclosure is not limited thereto.

The bezel area ZA is an area where an image is not displayed on the display device 100 and a wiring or circuit part is formed.

The pad area PA is an area where an image is not displayed and a plurality of pad electrodes 139 is formed. Herein, the pad area PA is an area where the pad electrodes 139 are bonded to external modules, for example, such as an FPCB (flexible printed circuit board), a COF (chip on film), and the like. The external modules such as an FPCB will be described later in detail with reference to FIG. 11. The pad area PA may also be positioned on one side of the bezel area ZA as illustrated in FIG. 1.

The flexible substrate 110 includes a bending area BA and a non-bending area NBA.

The bending area BA may be defined on a central portion of the display device 100. The non-bending area NBA may be defined on both sides of the bending area BA. Therefore, the flexible substrate 110 may include two non-bending areas NBA. Herein, the bending area BA is overlapped with a part of the display area DA and a part of the bezel area ZA. The non-bending area NBA is overlapped with a part of the display area DA, a part of the bezel area ZA, and the pad area PA.

The display device 100 is configured such that the bending area BA is bent. That is, the display device 100 may be configured such that the non-bending area NBA of the flexible substrate 110 can be maintained in a flat state without being bent. Further, the bending area BA of the flexible substrate 110 can be bent. Accordingly, the display device 100 may be bent such that two non-bending areas NBA of the flexible substrate 110 can face each other.

The thin film transistor 130 is disposed in the display area DA on the flexible substrate 110. The thin film transistor 130 includes an active layer 131, a gate electrode 132, a source electrode 133, and a drain electrode 134.

A buffer layer 111 is disposed on the flexible substrate 110. The buffer layer 111 may be formed of an inorganic material, for example, such as silicon nitride (SiNx) or silicon oxide (SiOx) and may include a single layer or a plurality of layers.

The active layer 131 is disposed on the buffer layer 111. A channel of the thin film transistor 130 is formed in the active layer 131. The active layer 131 may be formed on the buffer layer 111, and if the buffer layer 111 is not used, the active layer 131 may be formed directly on the flexible substrate 110.

A gate insulating layer 112 is disposed on the active layer 131. The gate insulating layer 112 is formed so as to insulate the active layer 131 and the gate electrode 132. The gate insulating layer 112 is formed of an inorganic material, for example, such as silicon nitride (SiNx) or silicon oxide (SiOx) and may include a single layer or a plurality of layers.

The gate electrode 132 is disposed on the gate insulating layer 112. An insulating interlayer 113 is disposed on the buffer layer 111. The insulating interlayer 113 may be formed in the display area DA. The insulating interlayer 113 includes a contact hole. The active layer 131 is electrically connected with the source electrode 133 and the drain electrode 134 through the contact hole. The insulating interlayer 113 may be formed of an inorganic material, for example, 1 such as silicon nitride (SiNx) or silicon oxide (SiOx) and may include a single layer or a plurality of layers.

The source electrode 133 and the drain electrode 134 are disposed on the insulating interlayer 113. Each of the source electrode 133 and the drain electrode 134 is electrically connected with the active layer 131 through the contact hole. For convenience in explanation, FIG. 2 illustrates that the thin film transistor 130 has a coplanar structure, but is not limited thereto.

An overcoat layer 114 is disposed on the thin film transistor 130. The overcoat layer 114 is an insulating layer configured to flatten an upper part of the thin film transistor 130. The overcoat layer 114 may be formed in the display area DA.

The display element 140 is disposed on the overcoat layer 114. The display element 140 is disposed in the display area DA and electrically connected with the thin film transistor 130. The display element 140 is disposed in the bending area BA and the non-bending area NBA. In this case, if the display device 100 is bent, a part of the display element 140 disposed in the bending area BA is also bent. Therefore, the display element 140 may be formed of a flexible material. The display element 140 may be, for example, an organic light emitting display element. In the following description, the display element 140 will be assumed as an organic light emitting display element, but is not limited thereto.

The display element 140 as an organic light emitting display element includes an anode 141, an organic light emitting layer 142, and a cathode 143.

The anode 141 is electrically connected with the thin film transistor 130. The anode 141 may be formed of a conductive material having a high work function in order to supply a hole to the organic light emitting layer 142. If the display device 100 is a top-emission organic light emitting display device, the anode 141 may include a reflective layer and a transparent conductive layer disposed on the reflective layer. The reflective layer may be formed of a metal material having an excellent reflectivity and the transparent conductive layer may be formed of a conductive material having a high work function. If the display device 100 is a bottomemission organic light emitting display device, the anode 141 may include a transparent conductive layer only.

The organic light emitting layer 142 may be any one of a red organic light emitting layer, a green organic light emitting layer, a blue organic light emitting layer, and a white organic light emitting layer. Further, if the organic light emitting layer 142 is a white organic light emitting layer, a color filter may be included in the display device 100.

The cathode 143 is disposed on the organic light emitting layer 142. The cathode 143 may be formed of a conductive layer having a low work function in order to supply an electron to the organic light emitting layer 142. The cathode 143 may be formed of, for example, transparent conductive oxide. Herein, the organic light emitting layer 142 may further include a metal doping layer.

An encapsulation layer 116 is disposed on the display element 140. The encapsulation layer 116 is configured to protect the display element 140 against shocks, moisture, oxygen, and the like from the outside. The encapsulation layer 116 may be formed of an inorganic material, for example, such as silicon nitride (SiNx) or silicon oxide (SiOx) and may include a single layer or a plurality of layers.

A first inorganic layer 181 is disposed on the flexible substrate 110. Herein, the first inorganic layer 181 is disposed in the bezel area ZA on the flexible substrate 110. The first inorganic layer 181 may be formed of the same material at the same time as any one of various inorganic layers formed in the display area DA. The first inorganic layer 181 may be formed by, for example, forming a buffer layer material on the flexible substrate 110 and then patterning the buffer layer material. Thus, the first inorganic layer 181 may be formed of the same material at the same time as the buffer layer 111, but is not limited thereto. The first inorganic layer 181 may be formed of the same material at the same time as the gate insulating layer 112 or the insulating interlayer 113. The first inorganic layer 181 may be omitted.

Referring to FIG. 1 and FIG. 2, the display device 100 includes the bending sensor 120.

The bending sensor 120 may include a curved unit 121, a wiring part 122, and a detection unit.

The curved unit 121 and the wiring part 122 of the bending sensor 120 may be formed into wirings. The wiring part 122 of the bending sensor 120 may be connected with the pad electrodes.

The curved unit 121 and the wiring part 122 of the bending sensor 120 may be positioned on the flexible substrate 110. Further, the detection unit of the bending sensor 120 may be positioned on an external module connected with the pad electrodes 139 or on the flexible substrate 110. The external module will be described later in detail with reference to FIG. 11.

The curved unit 121 and the wiring part 122 of the bending sensor 120 are formed on the first inorganic layer 181 in the bezel area ZA. The curved unit 121 and the wiring part 122 of the bending sensor 120 may be formed of a conductive material. The curved unit 121 and the wiring part 122 of the bending sensor 120 may be formed of the same material as the conductive material constituting the thin film transistor 130 or a conductive material constituting the display element 140. For example, the curved unit 121 and the wiring part 122 of the bending sensor 120 may be formed of the same material as the source electrode 133 and the drain electrode 134 of the thin film transistor 130. In this case, a conductive material for forming the source electrode 133 and the drain electrode 134 is disposed on the flexible substrate 110. Therefore, the curved unit 121 and the wiring part 122 of the bending sensor 120 may be formed at the same time as the source electrode 133 and the drain electrode 134 by patterning the disposed conductive material, but is not limited thereto. The curved unit 121 and the wiring part 122 of the bending sensor 120 may be formed of the same material at the same time as any one of the gate electrode 132 of the thin film transistor 130 and the anode 141 and the cathode 143 of the display element 140. In the following description, for convenience in explanation, the bending sensor 120 will be assumed as being formed of the same material as the source electrode 133 and the drain electrode 134 of the thin film transistor 130.

In the curved unit 121, an electric change occurs when the flexible substrate 110 is bent. The wiring part 122 is configured to connect the curved unit 121 and the detection unit. Therefore, the electric change occurring in the curved unit 121 may be transferred to the detection unit via the wiring part 122. Accordingly, the detection unit senses the electric change occurring in the curved unit 121 and detects bending information. Herein, the curved unit 121 may be positioned in the bending area BA of the flexible substrate, and the wiring part 122 may be positioned in the non-bending area NBA of the flexible substrate. If the display device 100 is bent, the bending area BA of the flexible substrate 110 is bent and the non-bending area NBA is maintained in a flat state. Therefore, the wiring part 122 disposed in the non-bending area NBA is hardly applied with a stress caused by bending the display device 100. In fact, most of the stress is focused on the curved unit 121 disposed in the bending area BA. Therefore, when the bending area BA is bent, the curved unit 121 is likely to be cracked. Accordingly, in the display device 100 according to an example embodiment of the present disclosure, the curved unit 121 may have a shape (for example, a diamond shape) capable of avoiding cracks caused by an external force. As an example, the curved unit may include two or more electric wires having a plurality of diamond shape wires connected to each other in a column, and the two or more electric wires may be parallel to each other. Further, the curved unit 121 may include wirings respectively extended in different directions. Therefore, when the bending area BA is bent, apart of the curved unit 121 is extended in a direction different from an extension direction of the curved unit 121. Accordingly, a force applied during bending is dispersed, and a stress applied to the curved unit 121 is reduced. Therefore, the possibility of cracks in the curved unit 121 can be reduced. The curved unit 121 may be formed into various shape wires in addition to the diamond shape wire.

A second inorganic layer 182 is disposed so as to cover the curved unit 121 and the wiring part 122 of the bending sensor 120. The second inorganic layer 182 is formed in the bezel area ZA on the flexible substrate 110. The second inorganic layer 182 may be formed of the same material at the same time as any one of various inorganic layers formed in the display area DA. For example, an encapsulation layer material is formed on the flexible substrate 110 on which the display element 140 is formed. The second inorganic layer 182 may be formed of the same material at the same time as the encapsulation layer 116 by patterning the encapsulation layer material. In some example embodiments, the second inorganic layer 182 may be omitted.

In the display device 100 according to an example embodiment of the present disclosure, the curved unit 121 and the wiring part 122 of the bending sensor 120 formed of a conductive material may be sealed by the first inorganic layer 181 and the second inorganic layer 182 formed of an inorganic material. Therefore, it is possible to minimize damage to the curved unit 121 and the wiring part 122 of the bending sensor 120 caused by moisture or oxygen.

Hereinafter, a principle of sensing a bending angle of the display device 100 by using the bending sensor 120 will be described in more detail with reference to FIG. 3.

Figure 3:
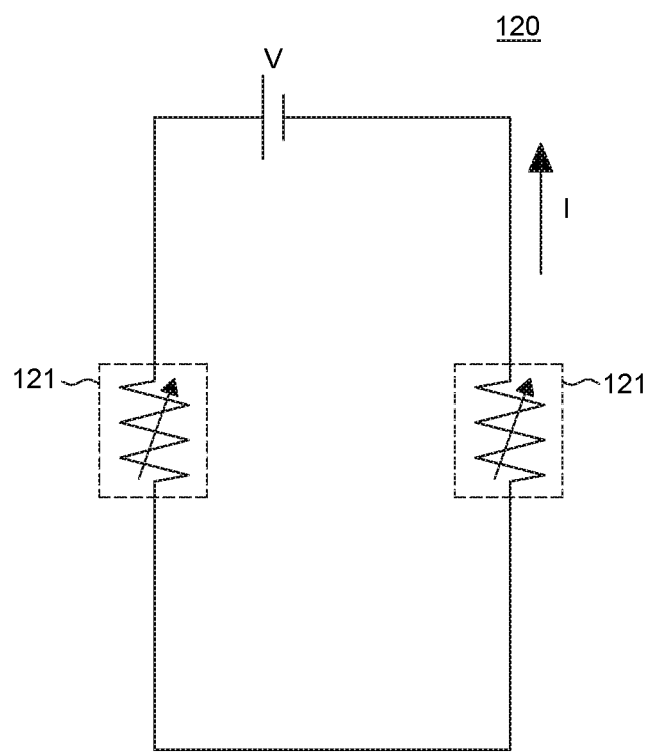
FIG. 3 is a circuit diagram provided to describe a sensing principle of a bending sensor according to an example embodiment of the present disclosure.

FIG. 3 is a circuit diagram provided to describe a sensing principle of a bending sensor according to an example embodiment of the present disclosure. In FIG. 3, the curved unit 121 of the bending sensor 120 is schematically illustrated as a variable resistance.

In order to detect a bending angle of the display device with the bending sensor 120, the bending sensor 120 is connected with a voltage source. Both ends of the bending sensor 120 may be connected to the voltage source, and a voltage V may be applied to the bending sensor 120. Therefore, a current I flows in the bending sensor 120. Herein, the detection unit of the bending sensor 120 measures a value of the current I applied to the curved unit 121 of the bending sensor 120 and calculates a resistance value of the curved unit 121 of the bending sensor 120.

The curved unit 121 of the bending sensor 120 serves as a variable resistance. Therefore, the resistance value of the curved unit 121 of the bending sensor 120 may vary depending on a bending angle of the display device. For example, if the display device is bent inwardly, i.e. the display device is bent such that both ends of a top surface of the display device can face each other, the curved unit 121 of the bending sensor 120 is applied with a compressive force. Therefore, the resistance value of the curved unit 121 of the bending sensor 120 is decreased. Accordingly, the current value applied to the curved unit 121 of the bending sensor 120 is increased. The detection unit of the bending sensor 120 senses an increase of a current value occurring in the curved unit 121 of the bending sensor 120. Therefore, the detection unit of the bending sensor 120 can calculate the decreased resistance value of the curved unit 121 of the bending sensor 120. The detection unit of the bending sensor 120 calculates a bending direction and a bending angle of the display device by comparing the decreased resistance value with a resistance value depending on a bending direction and a bending angle stored in a memory of the detection unit. Further, for example, if the display device is bent outwardly, i.e. the display device is bent such that both ends of a bottom surface of the display device can face each other, the curved unit 121 of the bending sensor 120 is applied with a tensile force. Therefore, the resistance value of the curved unit 121 of the bending sensor 120 is increased. Accordingly, the current value applied to the curved unit 121 of the bending sensor 120 is decreased.

The detection unit of the bending sensor 120 senses a decrease of a current value occurring in the curved unit 121 of the bending sensor 120. Therefore, the detection unit of the bending sensor 120 can calculate the increased resistance value of the curved unit 121 of the bending sensor 120. The detection unit of the bending sensor 120 calculates a bending direction and a bending angle of the display device by comparing the increased resistance value with a resistance value depending on a bending direction and a bending angle stored in the memory of the detection unit. Herein, a resistance value of the curved unit 121 of the bending sensor 120 depending on a bending direction and a bending angle of the display device may be stored in the memory. For example, the memory may store the resistance value of the curved unit 121 of the bending sensor 120 depending on the bending direction and the bending angle when the display device is bent inwardly and the resistance value of the curved unit 121 of the bending sensor 120 depending on the bending direction and the bending angle when the display device is bent outwardly. That is, the detection unit senses the electric change occurring in the curved unit 121 of the bending sensor 120 during bending of the display device and compares the sensed electric change with an electric change depending on a bending direction and a bending angle stored in the memory. Therefore, the detection unit can calculate a bending direction and a bending angle of the display device. In this case, the electric change may include other electric change values such as a current value or a voltage value in addition to a resistance value. The detection unit may be disposed on the flexible substrate or may be disposed in the form of FPCB or COF.

In the display device 100 according to an example embodiment of the present disclosure, the curved unit 121 and the wiring part 122 of the bending sensor 120 are formed of the conductive material constituting the thin film transistor 130 or the conductive material constituting the display element 140. Further, the curved unit 121 and the wiring part 122 of the bending sensor 120 may be formed at the same time as constituent elements of the thin film transistor 130 or constituent elements of the display device 140 which are formed of the same material. Therefore, an additional process for forming the curved unit 121 and the wiring part 122 of the bending sensor 120 is not needed. Therefore, since the curved unit 121 and the wiring part 122 of the bending sensor 120 can be manufactured during a manufacturing process of the thin film transistor 130 or a manufacturing process of the display element 140, no additional process cost is incurred and a manufacturing time is not increased.

Further, the curved unit 121 and the wiring part 122 of the bending sensor 120 is formed as being integrated with the display device 100. Furthermore, when the bending sensor 120 is added, thickness of the display device 100 is not increased. That is, since the curved unit 121 and the wiring part 122 of the bending sensor 120 can be formed into wirings in the bezel area ZA, even if the bending sensor 120 is integrated with the display device 100, it is possible to manufacture the slim display device 100.

In some example embodiments, the flexible substrate 110 may include at least two non-bending areas NBA and a bending area BA between the non-bending areas NBA. That is, there may be two non-bending areas NBA as illustrated in FIG. 1, or three non-bending areas NBA and two bending areas BA each disposed between the non-bending areas NBA. Otherwise, there may be four non-bending areas NBA.

A temperature sensor configured to sense a temperature of the bending sensor 120 may be disposed in the flexible substrate 110. If the curved unit 121 of the bending sensor 120 is formed of a conductive material such as a metal material, a resistance value of the curved unit 121 of the bending sensor 120 may vary depending on a temperature. If the temperature is increased, the resistance value of the curved unit 121 of the bending sensor 120 is increased, and if the temperature is decreased, the resistance value of the curved unit 121 of the bending sensor 120 is decreased. Therefore, although the display device 100 is actually not bent, the resistance value of the curved unit 121 of the bending sensor 120 may be changed as the temperature is changed. Thus, a process may wrongly determine that the display device 100 is bent. Therefore, the temperature sensor may be disposed in the flexible substrate 110. In addition, the memory of the detection unit may store a resistance value of the curved unit 121 of the bending sensor 120 depending on a bending direction and a bending angle at each temperature of the display device 100. Therefore, the detection unit may detect a bending angle of the display device 100 on the basis of a temperature value measured by the temperature sensor and a resistance value of the curved unit 121 of the bending sensor 120 depending on a bending direction and a bending angle stored in the memory.

Figure 4:
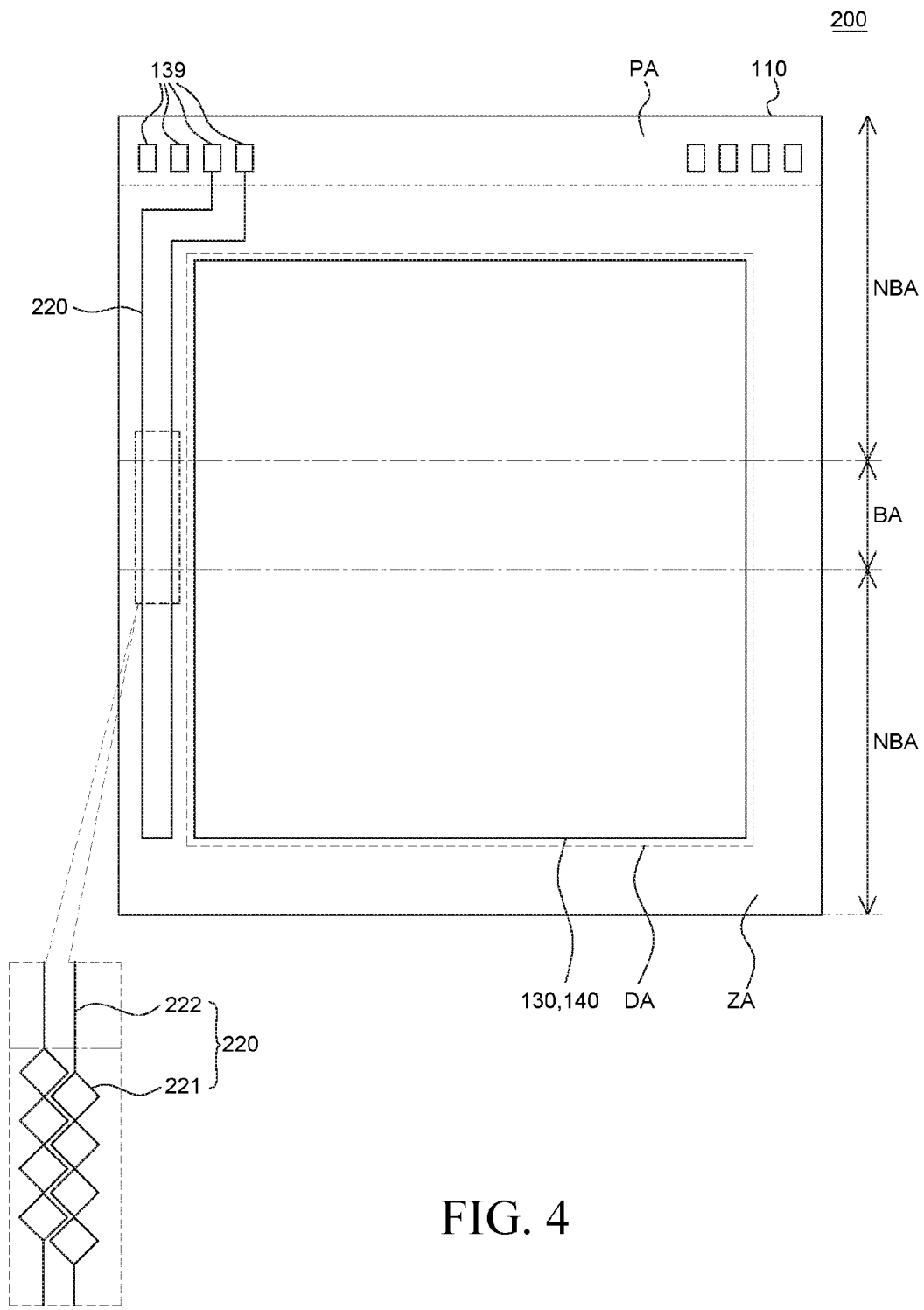
FIG. 4 is a plan view provided to describe a display device according to another example embodiment of the present disclosure.

FIG. 4 is a plan view provided to describe a display device according to another example embodiment of the present disclosure.

A display device 200 illustrated in FIG. 4 is substantially the same as the display device 100 illustrated in FIG. 1 and FIG. 2 except that a structure of a curved unit 221 of a bending sensor 220 is changed, and, thus, redundant explanation thereof will be omitted.

The bending sensor 220 includes the curved unit 221 disposed in the bending area BA and a wiring part 222 disposed in the non-bending area NBA. Herein, if the display device 200 is bent, only the bending area BA is bent but the non-bending area NBA is maintained in a flat state. Therefore, the wiring part 222 disposed in the non-bending area NBA is hardly applied with a stress caused by bending the display device 200, and most of the stress is focused on the curved unit 221 disposed in the bending area BA. Therefore, when the bending area BA is bent, the curved unit 221 is likely to be cracked. Accordingly, in the display device 200 according to another example embodiment of the present disclosure, the curved unit 221 may have a shape (for example, a diamond shape) capable of avoiding cracks caused by an external force. For example, the curved unit may include two or more wirings (electric wires) having a plurality of diamond shape wires connected to each other in a column, and the two or more wirings (electric wires) may be parallel to each other. Further, a diamond shape wire of any one of the wirings may be disposed so as to cross a diamond shape wire in an adjacent column in a zigzag pattern. That is, toothed portions of the diamond shape wires may be disposed so as to cross each other. Furthermore, the curved unit 221 may include wirings respectively extended in different directions. Therefore, when the bending area BA is bent, a part of the curved unit 221 is extended in a direction different from an extension direction of the curved unit 221. Accordingly, a force applied during bending is dispersed, and a stress applied to the curved unit 221 is reduced. Therefore, the possibility of cracks in the curved unit 221 can be reduced. Further, since the curved units 221 each having a diamond shape wire are formed so as to cross each other in a zigzag pattern, it is possible to reduce a width of the bezel area ZA where the curved unit 221 and the wiring part 222 of the bending sensor 220 are positioned, as compared with the case where the curved units are formed in parallel to each other. The curved unit 221 may be formed into various shape wires in addition to the diamond shape wire illustrated in FIG. 4.

Figure 5:
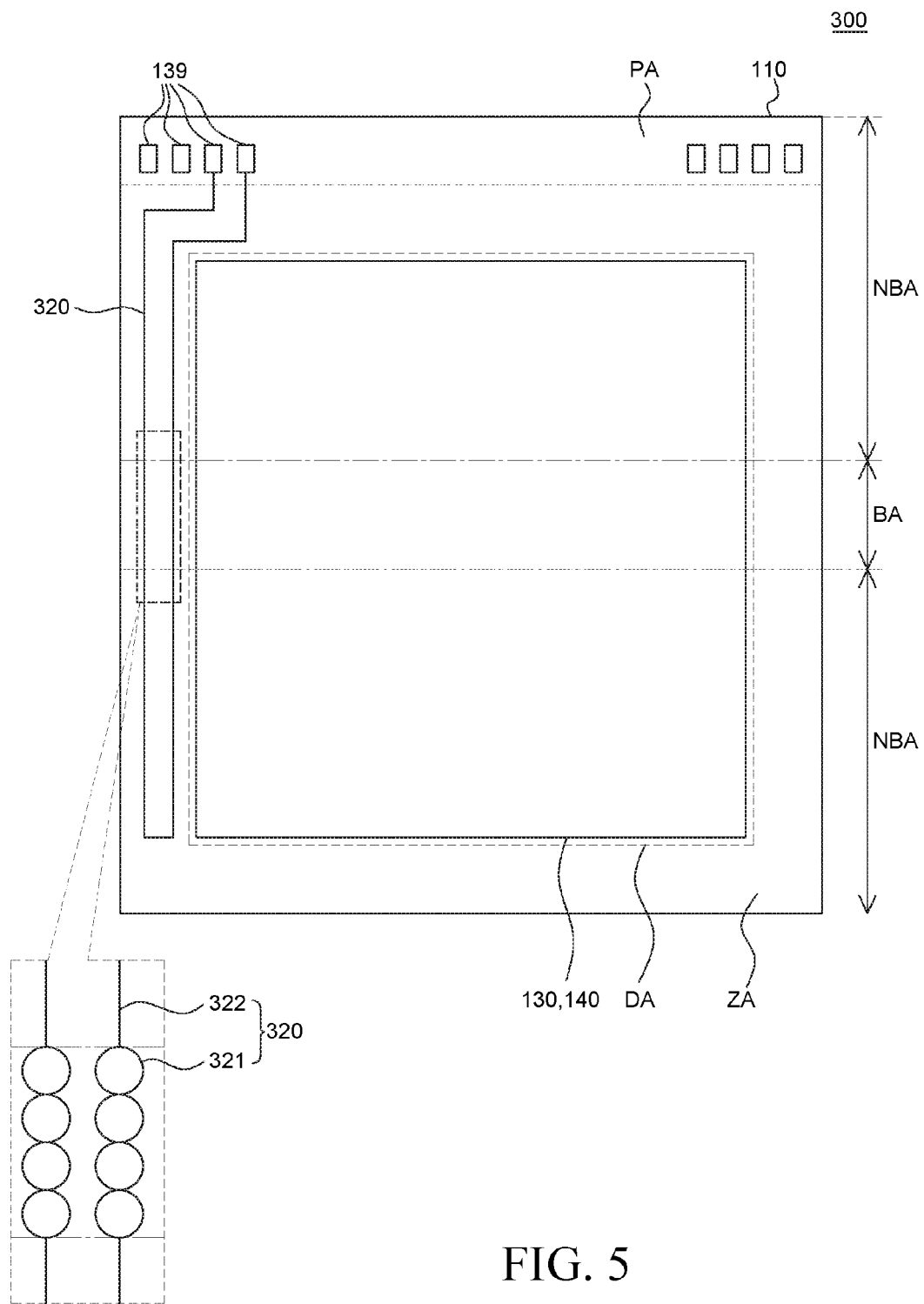
FIG. 5 is a plan view provided to describe a display device according to still another example embodiment of the present disclosure.

FIG. 5 is a plan view provided to describe a display device according to yet another example embodiment of the present disclosure.

A display device 300 illustrated in FIG. 5 is substantially the same as the display device 100 illustrated in FIG. 1 and FIG. 2 except that a structure of a curved unit 321 of a bending sensor 320 is changed, and, thus, redundant explanation thereof will be omitted.

The bending sensor 320 includes the curved unit 321 disposed in the bending area BA and the wiring part 322 disposed in the non-bending area NBA. Herein, if the display device 300 is bent, only the bending area BA is bent but the non-bending area NBA is maintained in a flat state. Therefore, the wiring part 322 disposed in the non-bending area NBA is hardly applied with a stress caused by bending of the display device 300, and most of the stress is focused on the curved unit 321 disposed in the bending area BA. Therefore, when the bending area BA is bent, the curved unit 321 is likely to be cracked. Accordingly, in the display device 300 according to yet another example embodiment of the present disclosure, the curved unit 321 may have a shape (for example, a circular shape) capable of avoiding cracks caused by an external force. As an example, the curved unit 321 may include two or more electric wires having a plurality of circular shape wires connected to each other in a column, and the two or more electric wires may be parallel to each other. Further, the curved unit 321 may include wirings respectively extended in different directions. Therefore, when the bending area BA is bent, a part of the curved unit 321 is extended in a direction different from an extension direction of the curved unit 321. Accordingly, a force applied during bending is dispersed, and a stress applied to the curved unit 321 is reduced. Therefore, the possibility of cracks in the curved unit 321 can be reduced. Furthermore, when the bending area BA is bent, a wiring of the curved unit 321 is not a straight line but a curve, and, thus, the curved unit 321 can be easily extended. Accordingly, a stress applied to the curved unit 321 is reduced, and, thus, the possibility of cracks in the curved unit 321 can be further reduced as compared with the case of a straight line.

The curved unit 321 may be formed into various shape wires in addition to the circular shape wire illustrated in FIG. 5.

Figure 6:
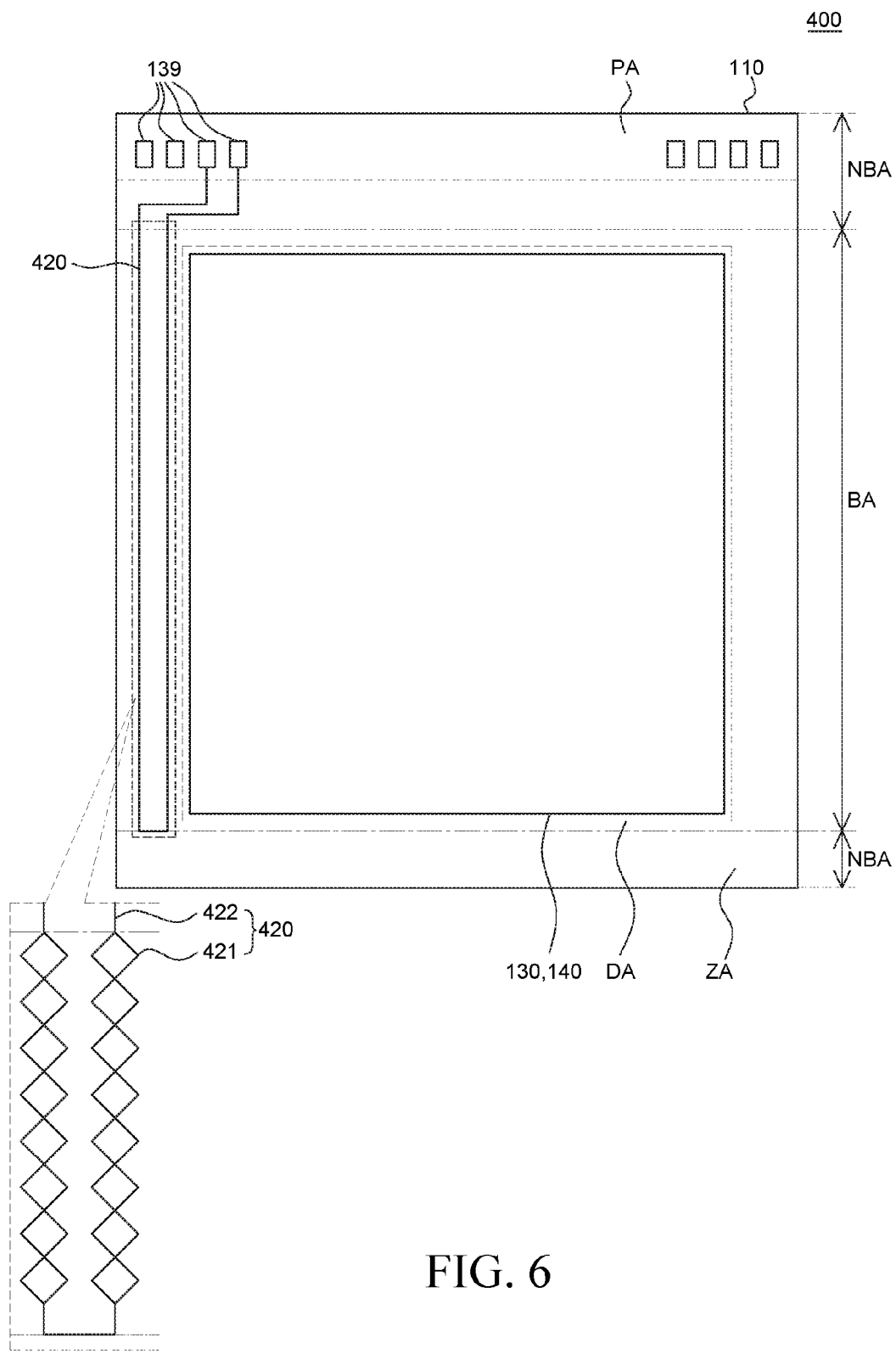
FIG. 6 is a plan view provided to describe a display device according to still another example embodiment of the present disclosure.

FIG. 6 is a plan view provided to describe a display device according to still another example embodiment of the present disclosure.

A display device 400 illustrated in FIG. 6 is substantially the same as the display device 100 illustrated in FIG. 1 and FIG. 2 except that sizes of the bending area BA and the non-bending area NBA are changed and a structure of a curved unit 421 of a bending sensor 420 is changed, and, thus, redundant explanation thereof will be omitted.

The flexible substrate 110 includes the bending area BA and the non-bending area NBA. Further, the flexible substrate 110 includes the display area DA where a thin film transistor and a display element are disposed, and the bezel area ZA is defined so as to surround the display area DA. The display area DA of the flexible substrate 110 is defined within the bending area BA. That is, the display area DA is not overlapped with the non-bending area NBA but is overlapped with the bending area BA only. Accordingly, since the display element 140 is also disposed in the bending area BA, the display element 140 needs to be formed of a flexible material.

Accordingly, the display element 140 may be an organic light emitting display element.

In the display device 400 according to still another example embodiment of the present disclosure, the display area DA is disposed in the bending area BA only, but not in the non-bending area NBA. That is, the display area DA is overlapped with the entire bending area BA. Therefore, the bending area BA in the display device 400 according to still another example embodiment of the present disclosure is greater than a bending area BA overlapped with a part of the display area DA. Accordingly, the cured unit 421 of the bending sensor 420 disposed in the bending area BA may be increased in number. Therefore, since a change in a resistance value of the curved unit 421 occurs in a greater area, the bending sensor 420 can detect a bending angle with more accuracy.

Figure 7:
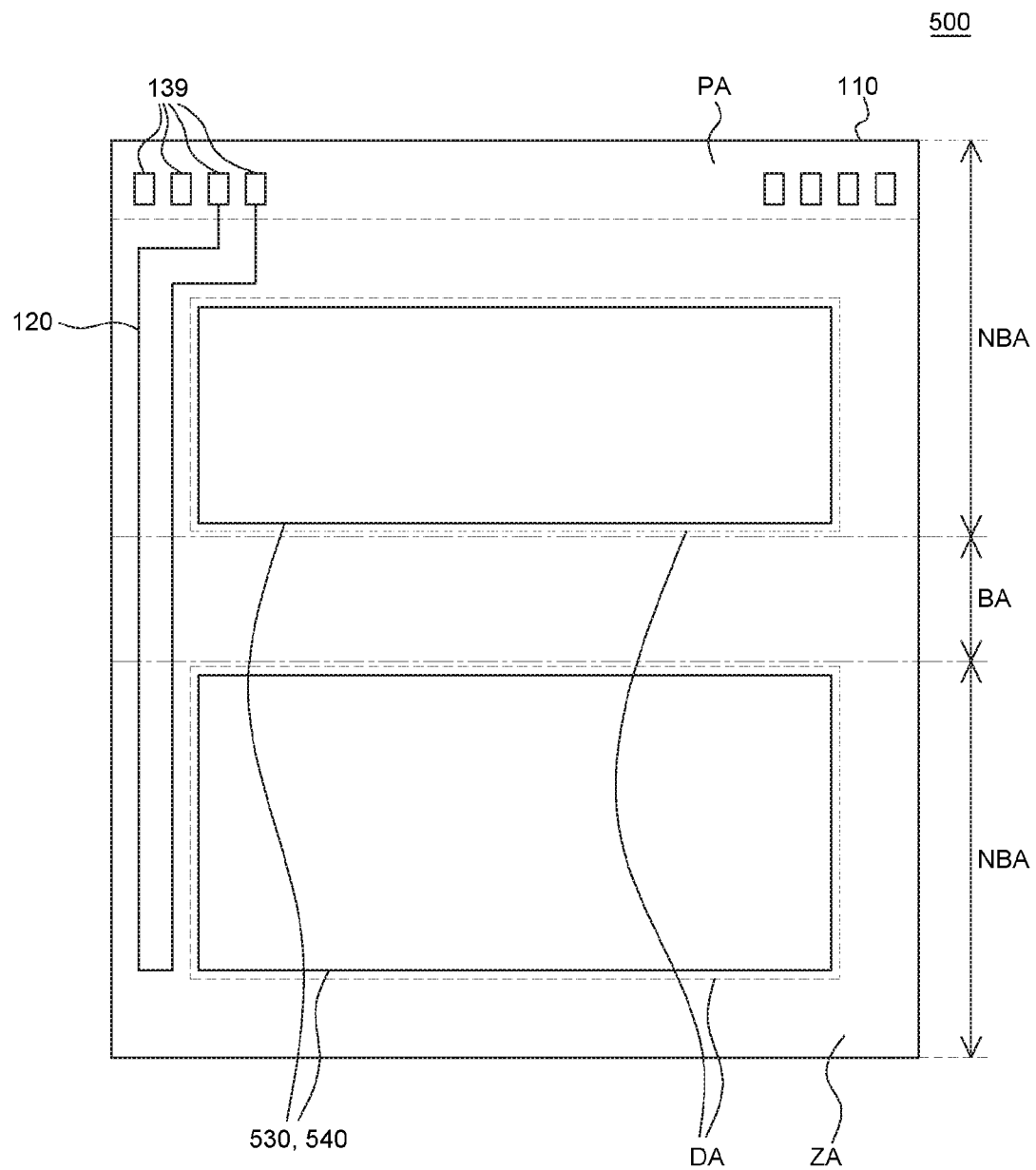
FIG. 7 is a plan view provided to describe a display device according to still another example embodiment of the present disclosure.

FIG. 7 is a plan view provided to describe a display device according to still another example embodiment of the present disclosure. A display device 500 illustrated in FIG. 7 is substantially the same as the display device 100 illustrated in FIG. 1 and FIG. 2 except that a shape and a size of the display area DA is changed and positions of a thin film transistor 530 and a display element 540 are changed, and, thus, redundant explanation thereof will be omitted.

As illustrated in FIG. 7, the flexible substrate 110 includes the bending area BA and two non-bending areas NBA. Further, the flexible substrate 110 includes two display areas DA where the thin film transistor 530 and the display element 540 are disposed, and the bezel area ZA is defined so as to surround the display areas DA. The display areas DA of the flexible substrate 110 are respectively defined within the non-bending areas NBA. Therefore, the bending area BA includes a part of the bezel area ZA but does not include the display areas DA. That is, the display areas DA are not overlapped with the bending area BA but overlapped with only a part of the non-bending area NBA. Therefore, since the display element 540 is not disposed in the bending area BA, the display element 540 may not be formed of a flexible material. Accordingly, the display element 540 may be one of other display elements such as an organic light emitting display element and a liquid crystal display element.

In the display device 500 according to still another example embodiment of the present disclosure, the display areas DA are disposed in the non-bending area NBA, but not in the bending area BA. Accordingly, the display element 540 may not be formed of a flexible material. Therefore, as the display device 500 according to still another example embodiment of the present disclosure, various display elements such as an organic light emitting display element and a liquid crystal display element can be applied. Further, in the display device 500 according to still another example embodiment of the present disclosure, since a plurality of display areas DA is defined, a plurality of display elements 540 is disposed on the flexible substrate 110. Therefore, it is possible to provide a plurality of display screens to a user.

Figure 8:
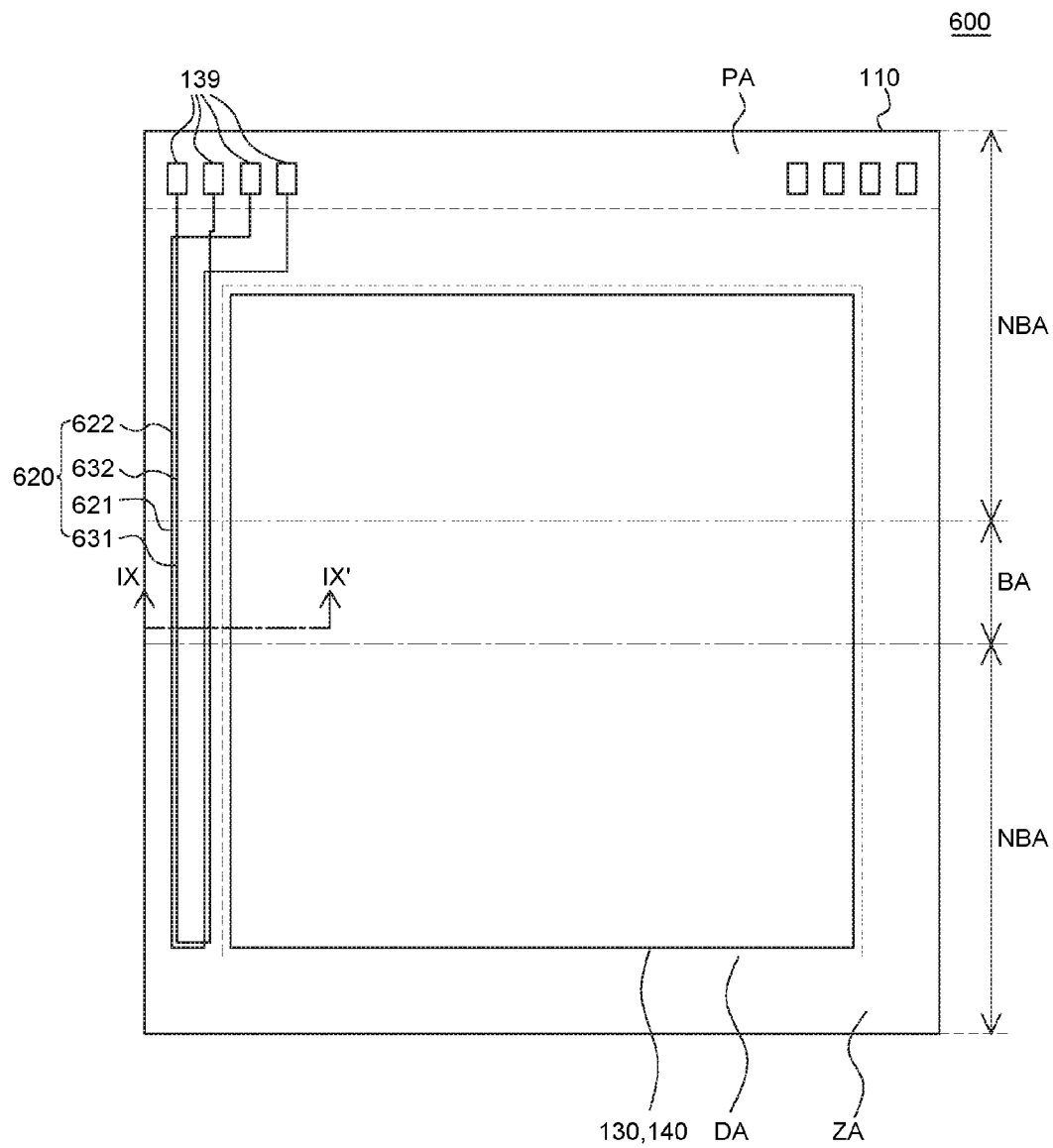
FIG. 8 is a plan view provided to describe a display device according to still another example embodiment of the present disclosure.
Figure 9:
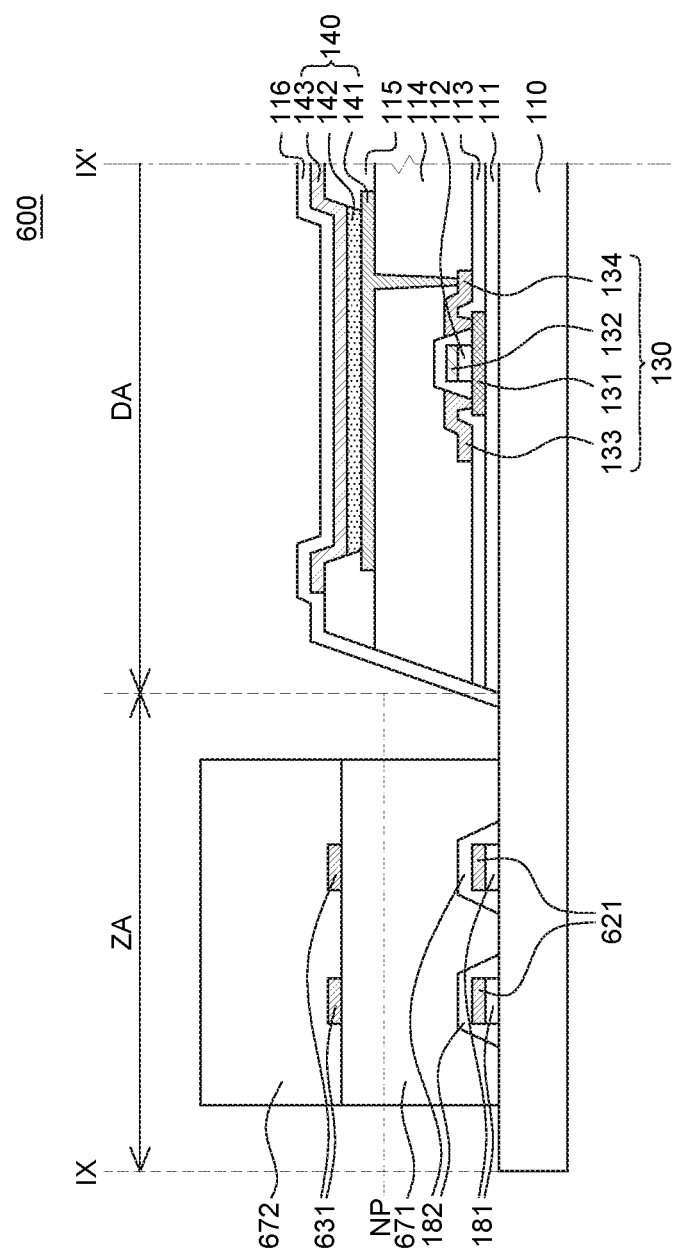
FIG. 9 is a cross-sectional view taken along a line IX-IX' of FIG. 8 and provided to describe the display device according to still another example embodiment of the present disclosure.

FIG. 8 is a plan view provided to describe a display device according to still another example embodiment of the present disclosure. FIG. 9 is a cross-sectional view taken along a line IX-IX' of FIG. 8 and provided to describe the display device according to still another example embodiment of the present disclosure. A display device 600 illustrated in FIG. 8 and FIG. 9 is substantially the same as the display device 100 illustrated in FIG. 1 and FIG. 2 except that a structure of a bending sensor 620 is changed and a first insulating layer 671 and a second insulating layer 672 are added, and, thus, redundant explanation thereof will be omitted.

As illustrated in FIG. 8 and FIG. 9, the bending sensor 620 includes a first curved unit 621, a second curved unit 631, a first wiring part 622, and a second wiring part 632. The first curved unit 621 and the second curved unit 622 are formed on the first inorganic layer 181. The second inorganic layer 182 is disposed so as to cover the first curved unit 621 and the first wiring part 622. The first curved unit 621 and the first wiring part 622 are substantially the same as the curved unit 121 and the wiring part 122 of the bending sensor 120 illustrated in FIG. 1 and FIG. 2, and, thus, redundant explanation thereof will be omitted.

The first insulating layer 671 is disposed on the first curved unit 621. The first insulating layer 671 may be formed of, for example, heat-curable or UV-curable resin, and specifically, acryl-based resin, epoxy-based resin, and the like. The thickness of the first insulating layer 671 is determined such that the first curved unit 621 and the second curved unit 631 can be positioned on opposite sides of the neutral plane NP.

The second curved unit 631 is disposed on the first insulating layer 671. That is, the first insulating layer 671 is disposed between the first curved unit 621 and the second curved unit 631. For convenience in illustration, FIG. 8 illustrates that the first curved unit 621 is not overlapped with the second curved unit 631. However, the second curved unit 631 is disposed so as to be overlapped with the first curved unit 621 on the first insulating layer 671 as illustrated in FIG. 9. The second curved unit 631 may be formed of the same material as the conductive material constituting the thin film transistor 130 or the conductive material constituting the display element 140. The second curved unit 631 may be disposed in the bending area BA and formed into a shape of the curved unit 121 illustrated in FIG. 1.

The second insulating layer 672 is disposed on the second curved unit 631. The second insulating layer 672 may be formed of, for example, heat-curable or UV-curable resin, and specifically, acryl-based resin, epoxy-based resin, and the like. Further, the second insulating layer 672 may be formed of the same material as the first insulating layer 671. The thickness of the second insulating layer 672 is determined such that the first curved unit 621 and the second curved unit 631 can be positioned on opposite sides of the neutral plane NP.

As illustrated in FIG. 9, the first curved unit 621 is disposed under the neutral plane NP, and the second curved unit 631 is disposed on the neutral plane NP. Herein, the neutral plane NP refers to a virtual plane which is not applied with a stress since a compressive force and a tensile force cancel each other when the display device 600 is bent inwardly or outwardly. The neutral plane NP is determined considering thickness, Young's Modulus, and a material of the elements of the display device 600 disposed in the bezel area ZA. A position of the neutral plane NP may be changed due to another element present on or under the neutral plane. Therefore, in order to adjust a position of the neutral plane NP, a material and a structure which can minimize an influence on the neutral plane may be used for another element present on or under a desired position of the neutral plane NP. Otherwise, a position of the neutral plane NP may be adjusted to a desired position by changing thickness and a structure of another element present on or under the desired position of the neutral plane NP. In the display device 600 according to still another example embodiment of the present disclosure, the first insulating layer 671 and the second insulating layer 672 are used. Accordingly, the first curved unit 621 and the second curved unit 631 are positioned on opposite sides of the neutral plane NP.

As illustrated in FIG. 9, the first curved unit 621 is disposed under the neutral plane NP, and the second curved unit 631 is disposed on the neutral plane NP. Therefore, when the display device 600 is bent, one of the first curved unit 621 and the second curved unit 631 may be applied with a tensile force and the other one may be applied with a compressive force. Therefore, the display device 600 according to still another example embodiment of the present disclosure uses a plurality of curved units 621 and 631 and is configured such that one of the curved units is applied with a compressive force and the other one is applied with a tensile force. Thus, it is possible to detect a bending angle of the display device 600 with more accuracy.

The bending sensor 620 may include three or more curved units. That is, the bending sensor 620 may include a third curved unit formed on the second curved unit 631 in addition to the first curve part 621 and the second curved unit 631. Further, the bending sensor 620 may further include curved units. Accordingly, accuracy in detection of a bending angle of the display device 600 can be improved.

A stress applied to the first curved unit 621 and the second curved unit 631 will be described in more detail with reference to FIG. 10.

Figure 10:
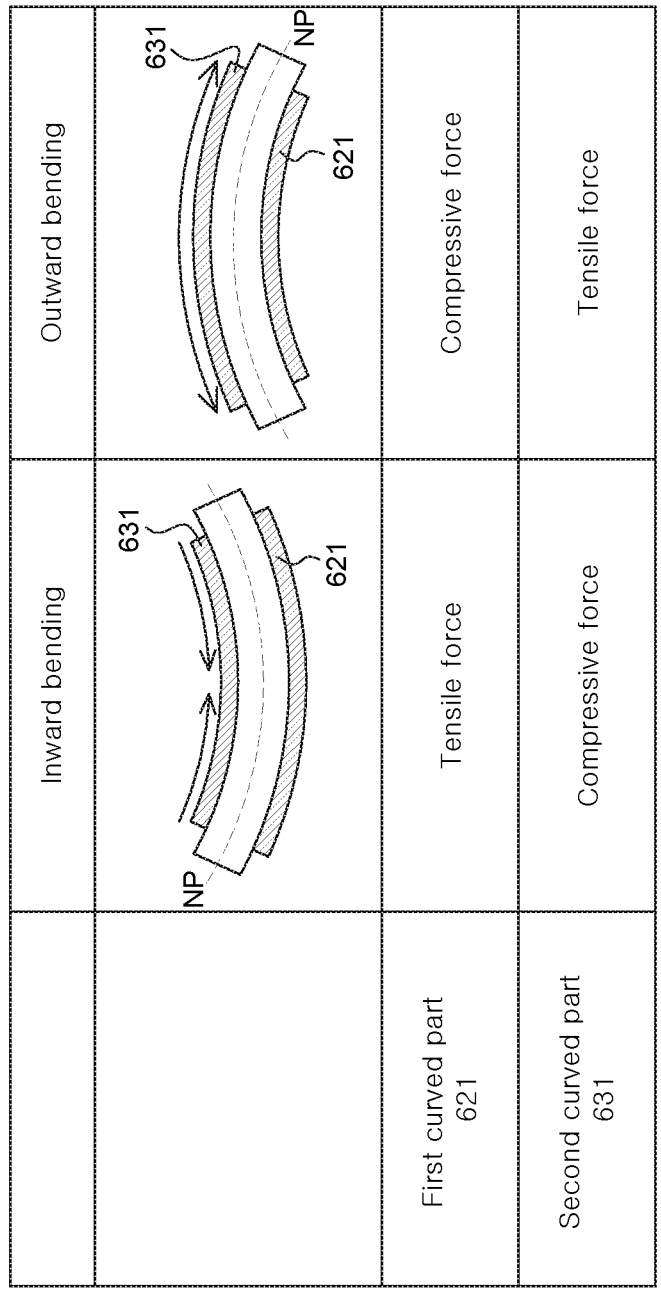
FIG. 10 is a table provided to describe an operation principle of a bending sensor of a display device according to still another example embodiment of the present disclosure.

FIG. 10 is a table provided to describe an operation principle of a bending sensor of a display device according to still another example embodiment of the present disclosure. For convenience in explanation, FIG. 10 illustrates that any supporting member is disposed between the first curved unit 621 and the second curved unit 631. Inward bending refers to a case where the supporting member is bent such that both ends of the supporting member are raised and a central portion of the supporting member is lowered. Outward bending refers to a case where the supporting member is bent such that the both ends of the supporting member are lowered and the central portion of the supporting member is raised.

As illustrated in FIG. 10, if the supporting member is bent inwardly, the first curved unit 621 disposed under the supporting member is lengthened. Therefore, the first curved unit 621 is applied with a tensile force. Further, if the supporting member is bent inwardly, the second curved unit 631 disposed on the supporting member is compressed. Therefore, the second curved unit 631 is applied with a compressive force. Accordingly, during inward bending, the first curved unit 621 is applied with a tensile force and its resistance is increased, and the second curved unit 631 is applied with a compressive force and its resistance is decreased.

Further, as illustrated in FIG. 10, if the supporting member is bent outwardly, the first curved unit 621 disposed under the supporting member is compressed. Therefore, the first curved unit 621 is applied with a compressive force. Further, if the supporting member is bent inwardly, the second curved unit 631 disposed on the supporting member is lengthened. Therefore, the second curved unit 631 is applied with a tensile force. Accordingly, during outward bending, the first curved unit 621 is applied with a compressive force and its resistance is decreased, and the second curved unit 631 is applied with a tensile force and its resistance is increased.

Depending on a bending direction, one of the first curved unit 621 and the second curved unit 631 is applied with a tensile force and its resistance is increased and the other one is applied with a compressive force and its resistance is decreased. Accordingly, a bending angle of the display device 600 can be detected. To be specific, a resistance value of the first curved unit 621 and a resistance value of the second curved unit 631 depending on a bending direction and a bending angle of the display device 600 may be stored in the memory of the detection unit. The detection unit may calculate a resistance value of the first curved unit 621 by using a voltage value applied to the first curved unit 621 and a current value applied to the first curved unit 621. Further, the detection unit may calculate a resistance value of the second curved unit 631 by using a voltage value applied to the second curved unit 631 and a current value applied to the second curved unit 631. The detection unit may detect a bending angle of the display device 600 by comparing the calculated resistance value of the first curved unit 621 and the calculated resistance value of the second curved unit 631 with a resistance value of the first curved unit 621 and a resistance value of the second curved unit 631 depending on a bending direction and a bending angle stored in the memory of the detection unit.

Figure 11:
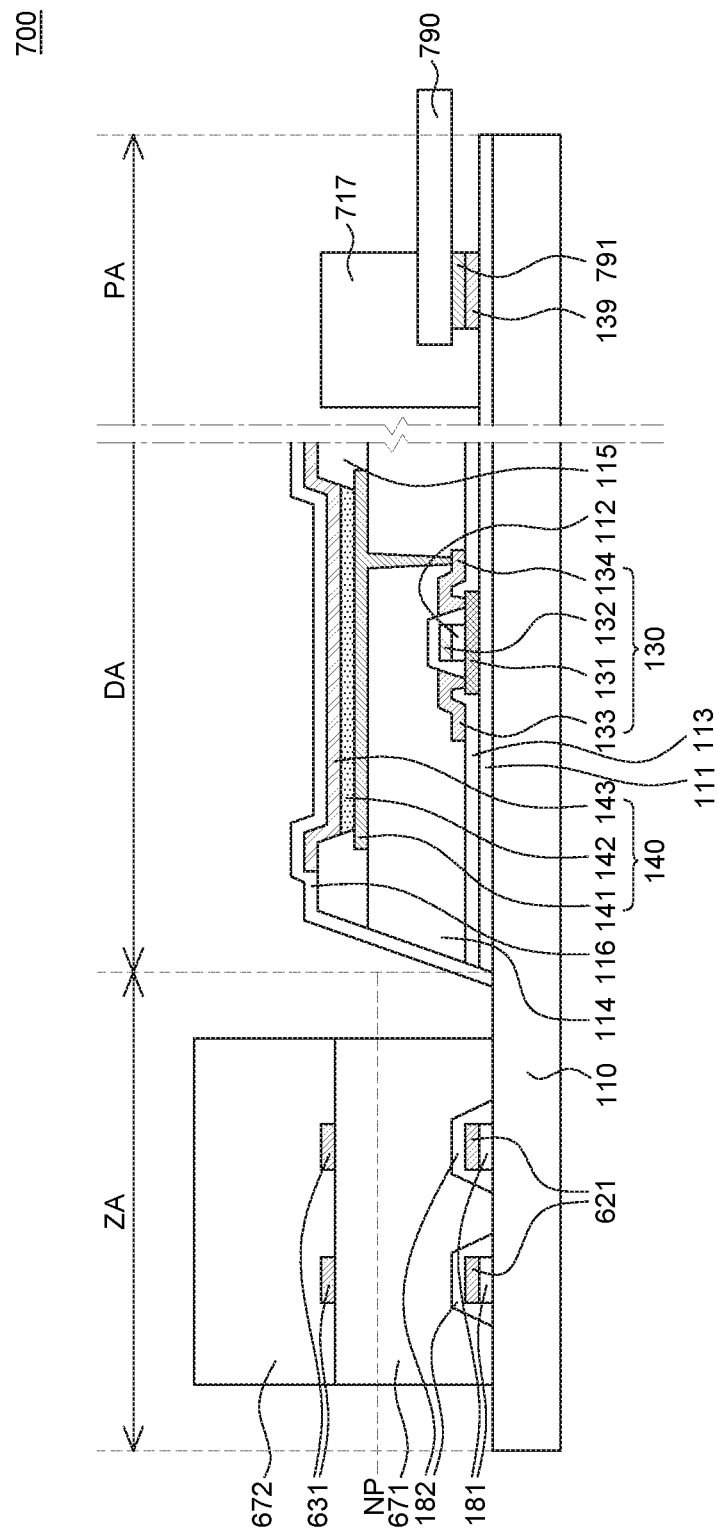
FIG. 11 is a cross-sectional view provided to describe a display device according to still another example embodiment of the present disclosure.

FIG. 11 is a cross-sectional view provided to describe a display device according to still another example embodiment of the present disclosure. A display device 700 illustrated in FIG. 11 is substantially the same as the display device 600 illustrated in FIG. 8 and FIG. 9 except that an FPCB 790 and a resin layer 717 are added, and, thus, redundant explanation thereof will be omitted.

As illustrated in FIG. 11, the FPCB 790 is a printed circuit board having flexibility. A control unit such as an IC chip or a circuit unit may be mounted on the FPCB 790. Further, the above-described detection unit may be mounted on the FPCB 790. The FPCB 790 is configured to transfer a signal for driving the display element 140 from the control unit to the display element 140 and mount the detection unit for detecting a bending angle of the display device 700.

The FPCB 790 is bonded on the pad electrode 139 of the pad area PA. To be specific, the FPCB 790 is bonded to the pad electrode 139 such that a connection electrode 791 of the FPCB 790 can be electrically connected with the pad electrode 139.

The resin layer 717 is disposed on the flexible substrate 110 so as to cover an end of the FPCB 790. The resin layer 717 is configured to protect and fix the FPCB 790.

The resin layer 717 may be formed of an insulating material. The resin layer 717 may be formed of, for example, heat-curable or UV-curable resin, and specifically, acryl-based resin, epoxy-based resin, and the like.

The first insulating layer 671 may be formed of the same material as the resin layer 717. That is, the first insulating layer 671 and the resin layer 717 may be formed at the same time by using the same material. For example, acryl-based resin or epoxy-based resin is coated on the bezel area ZA and the pad area PA at the same time, and the resin is cured by using heat or UV. Accordingly, the first insulating layer 671 and the resin layer 717 can be formed at the same time. In this case, the first insulating layer 671 and the resin layer 717 may have the same thickness.

Otherwise, instead of the first insulating layer 671, the second insulating layer 672 may be formed of the same material as the resin layer 717. Alternatively, all of the first insulating layer 671 and the second insulating layer 672 may be formed of the same material as the resin layer 717. In this case, one of the first insulating layer 671 and the second insulating layer 672 may be formed at the same time as the resin layer 717.

Figure 12:
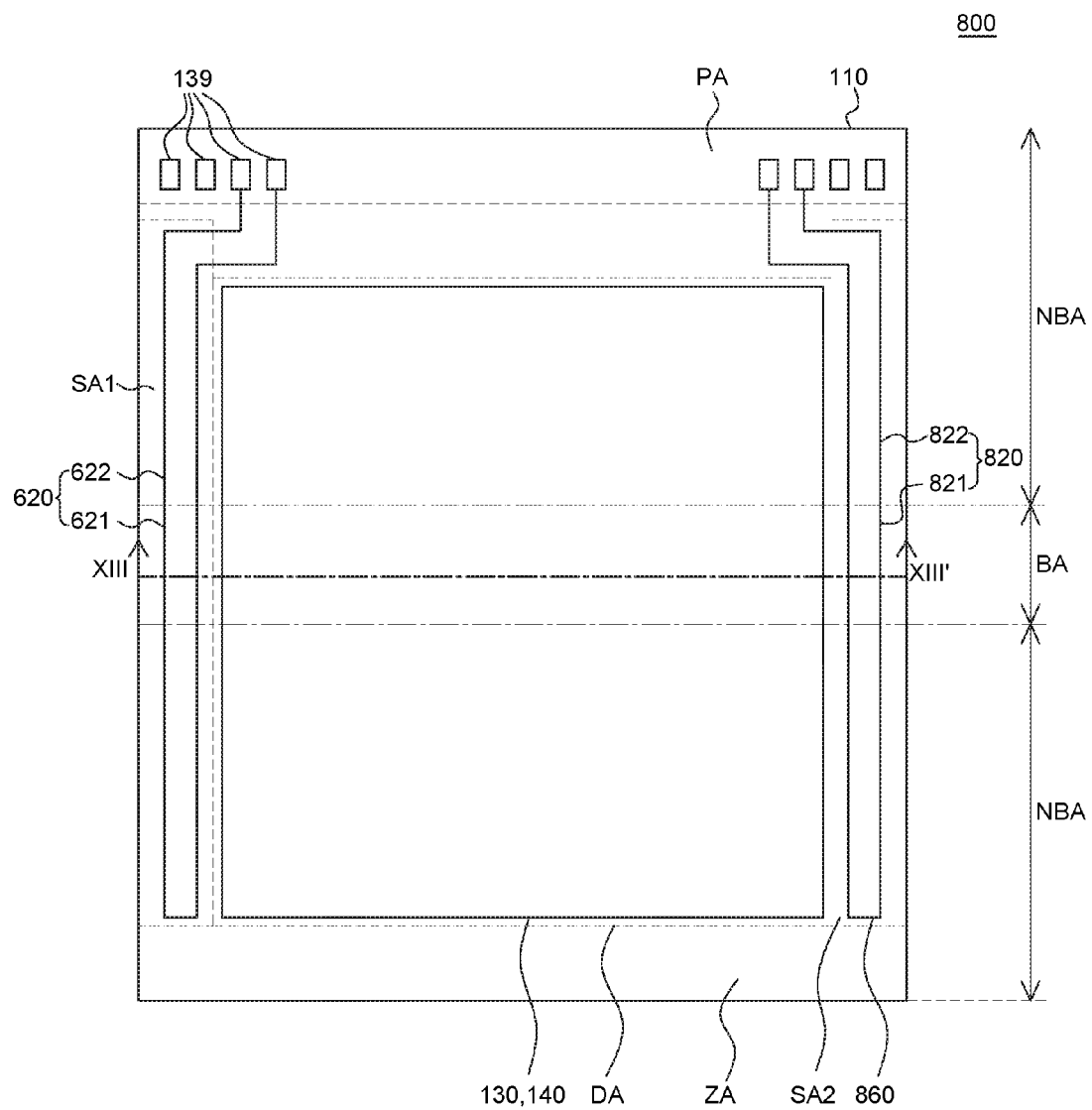
FIG. 12 is a plan view provided to describe a display device according to still another example embodiment of the present disclosure.
Figure 13:
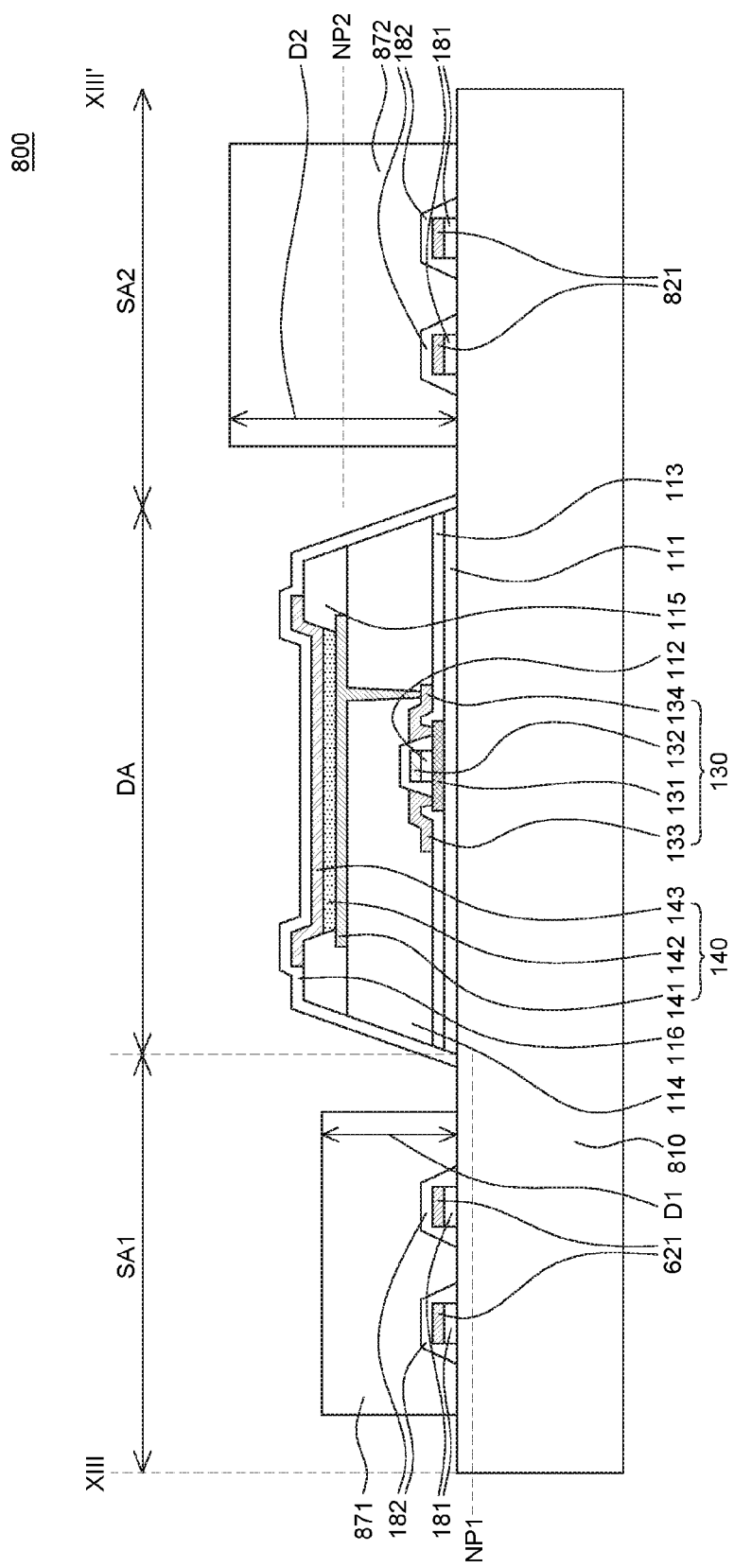
FIG. 13 is a cross-sectional view taken along a line XIII-XIII' of FIG. 12 and provided to describe the display device according to still another example embodiment of the present disclosure.

FIG. 12 is a plan view provided to describe a display device according to still another example embodiment of the present disclosure. FIG. 13 is a cross-sectional view taken along a line XIII-XIII' of FIG. 12 and provided to describe the display device according to still another example embodiment of the present disclosure. A display device 800 illustrated in FIG. 12 and FIG. 13 is substantially the same as the display device 600 illustrated in FIG. 8 and FIG. 9 except that only a flexible substrate 810, a second bending sensor 820, a first insulating layer 871, and a second insulating layer 872 are changed, and, thus, redundant explanation thereof will be omitted. For convenience in illustration, FIG. 13 illustrates that only the single thin film transistor 130 and the single display element 140 are disposed in the display area DA.

As illustrated in FIG. 12 and FIG. 13, the bezel area ZA of the flexible substrate 810 includes a first sensing area SA1 and a second sensing area SA2. The first sensing area SA1 is an area where the first curved unit 621 and the first wiring part 622 of a first bending sensor 620 are disposed, and is disposed on one side of the display area DA. The second sensing area SA2 is an area where a second curved unit 821 and a second wiring part 822 of the second bending sensor 820 are disposed, and is disposed on the opposite side facing the one side of the display area DA. For example, the first sensing area SA1 is adjacent to a left side of the display area DA and the second sensing area SA2 is adjacent to a right side of the display area DA.

The first curved unit 621 of the first bending sensor 620 is disposed in the first sensing area SA1. The first insulating layer 871 is disposed on the first curved unit 621 in the first sensing area SA1. The thickness D1 of the first insulating layer 871 is determined such that the first curved unit 621 is disposed on a first neutral plane NP1 in the first sensing area SA1. Further, if it is difficult to dispose the curved unit 621 of the first bending sensor 620 on the first neutral plane NP1 just by adjusting the thickness D1 of the first insulating layer 871, the thickness of the flexible substrate 810 may be adjusted.

The second curved unit 821 of the second bending sensor 820 is disposed in the second sensing area SA2. The second insulating layer 872 is disposed on the second curved unit 821 in the second sensing area SA2. The first curved unit 621 and the second curved unit 821 are disposed on the flexible substrate 810. Herein, the thickness of the first inorganic layer 181 disposed on the flexible substrate 810 and under the first curved unit 621 may be the same as the thickness of the first inorganic layer 181 disposed on the flexible substrate 810 and under the second curved unit 821. Therefore, the first curved unit 621 may be positioned at the same height at the second curved unit 821. Further, the first curved unit 621 and the second curved unit 821 may be positioned on the same layer. The thickness D2 of the second insulating layer 872 is determined such that the second curved unit 821 can be positioned under a second neutral plane NP in the second sensing area SA2. That is, the thickness D2 of the second insulating layer 872 may be greater than the thickness D1 of the first insulating layer 871 in order to dispose the first curved unit 621 on the first neutral plane NP1 and the second curbed part 821 under the second neutral plane NP2. Further, the first bending sensor 620 and the second bending sensor 820 may be formed of the same conductive material at the same time.

In the display device 800 according to still another example embodiment of the present disclosure, the first bending sensor 620 and the second bending sensor 820 are disposed on the same layer and may be formed of the same material. Further, the first bending sensor 620 and the second bending sensor 820 may be formed of the same material as the conductive material constituting the thin film transistor 130 or the conductive material constituting the display element 140 which are disposed in the display area DA. Therefore, an additional process for forming the first bending sensor 620 and the second bending sensor 820 is not needed. Furthermore, the first bending sensor 620 is disposed on the first neutral plane NP1 and the second bending sensor 820 is disposed under the second neutral plane NP2. Therefore, during bending of the display device 800, one of the first bending sensor 620 and the second bending sensor 820 is applied with a compressive force and the other one is applied with a tensile force. Thus, it is possible to detect a bending angle of the display device 800 with more accuracy.

Further, the thickness D1 of the first insulating layer 871 may be greater than the thickness D2 of the second insulating layer 872. Herein, the first bending sensor 620 may be disposed under the first neutral plane NP1 in the first sensing area SA1 and the second bending sensor 820 may be disposed on the second neutral plane NP2 in the second sensing area SA2.

Figure 14:
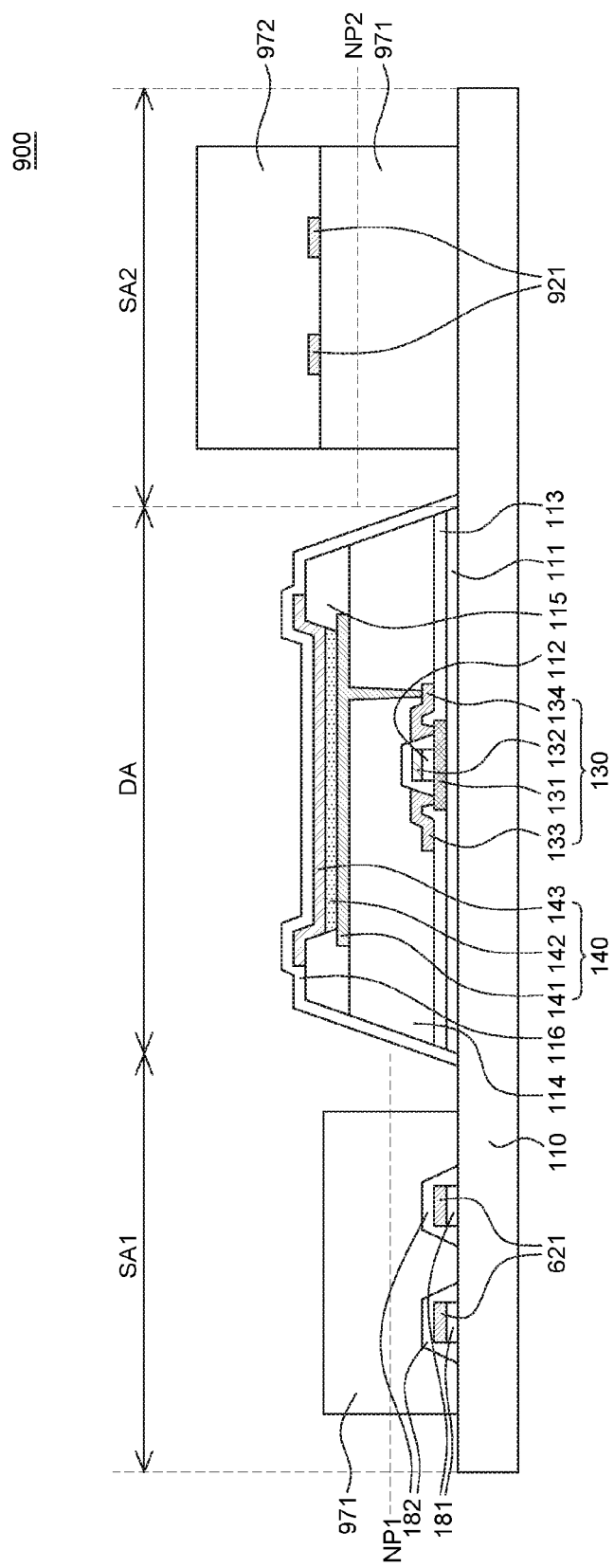
FIG. 14 is a cross-sectional view provided to describe a display device according to still another example embodiment of the present disclosure.

FIG. 14 is a cross-sectional view provided to describe a display device according to still another example embodiment of the present disclosure. A display device 900 illustrated in FIG. 14 is substantially the same as the display device 600 illustrated in FIG. 8 and FIG. 9 except that positions of a second bending sensor, a first insulating layer 971, and a second insulating layer 972 are changed, and, thus, redundant explanation thereof will be omitted. For convenience in illustration, FIG. 14 illustrates that only the single thin film transistor 130 and the single display element 140 are disposed in the display area DA.

As illustrated in FIG. 14, the flexible substrate 110 includes the first sensing area SA1 and the second sensing area SA2. The first sensing area SA1 is an area where the first curved unit 621 of the first bending sensor is disposed, and is positioned on one side of the display area DA. The second sensing area SA2 is an area where a second curved unit 921 of the second bending sensor is disposed, and is positioned on the opposite side facing the one side of the display area DA. For example, the first sensing area SA1 is adjacent to a left side of the display area DA and the second sensing area SA2 is adjacent to a right side of the display area DA.

The first curved unit 621 and the first insulating layer 971 are disposed in the first sensing area SA1. The first curved unit 621 is disposed on the flexible substrate 110 in the first sensing area SA1. The first insulating layer 971 is disposed in the first sensing area SA1 so as to cover the first curved unit 621. The thickness of the first insulating layer 971 is determined such that the first curved unit 621 can be disposed under the first neutral plane NP1 in the first sensing area SA1.

The first insulating layer 971, the second curved unit 921, and the second insulating layer 972 are disposed in the second sensing area SA2. The first insulating layer 971 is disposed on the flexible substrate 110 in the second sensing area SA2. The second curved unit 921 is disposed on the first insulating layer 971. The second insulating layer 972 is disposed on the first insulating layer 971 so as to cover a second bending sensor. The thickness of the second insulating layer 972 is determined such that the second curved unit 921 can be disposed on the second neutral plane NP2 in the second sensing area SA2.

In the display device 900 according to still another example embodiment of the present disclosure, the first curved unit 621 is disposed under the first neutral NP1 and the second curved unit 921 is disposed on the second neutral plane NP2. Therefore, during bending of the display device 900, one of the first curved unit 621 and the second curved unit 921 is applied with a compressive force and the other one is applied with a tensile force. Thus, it is possible to detect a bending angle of the display device 900 with more accuracy.

According to example embodiments of the present disclosure, it is possible to calculate a bending direction and a bending angle by using a bending sensor including a curved unit where an electric change occurs and a detection unit configured to sense the electric change and detect bending information.

Further, according to an example embodiment of the present disclosure, since a bending sensor which can be formed at the same time when a thin film transistor or a display element is formed is included, it is possible to manufacture the bending sensor without additional cost.

It will be apparent to those skilled in the art that various modifications and variations can be made in the display device comprising a bending sensor of the present invention without departing from the spirit or scope of the invention. Thus, it is intended that the present invention cover the modifications and variations of this invention provided they come within the scope of the appended claims and their equivalents.

What is claimed is:

1. A display device, comprising:
   a flexible substrate including a display area, a bezel area surrounding the display area and a pad area extended from at least one side of the bezel area; and
   a bending sensor including a pair of curved units and a pair of wiring parts connected to each other and disposed in the bezel area, and in which each end of the bending sensor is connected to one of pad electrodes disposed in the pad area,
   wherein the pair of curved units faces each other and the pair of wiring parts faces each other at an edge of the display area,
   wherein an electric change occurs in the pair of curved units when the flexible substrate is bent, and the bending sensor configured to detect bending information by sensing the electric change, and
   wherein the pair of curved units includes two or more electric wires respectively extended in different directions with the pair of wiring parts to disperse a force applied when the flexible substrate is bent.

2. The display device according to claim 1, wherein the pair of curved units is parallel to the edge of the display area.

3. The display device according to claim 2, wherein the pair of curved units comprising two or more electric wires has a plurality of diamond shape wires connected to each other in a column.

4. The display device according to claim 3, wherein the diamond shape wires cross each other in a zigzag pattern.

5. The display device according to claim 2, wherein the pair of curved units comprising two or more electric wires has a plurality of circular shape wires connected to each other in a column.

6. The display device according to claim 1, further comprising a first insulating layer on the flexible substrate,
   wherein a bending area is defined on a central portion of the display device in a direction perpendicular to the columns and non-bending areas are defined on respective sides of the bending area,
   wherein a neutral plane is defined in the first insulating layer parallel to the flexible substrate where no stress is applied by the flexible substrate being bent in the bending area,
   wherein the pair of curved units includes a first pair of curved units below the neutral plane and a second pair of curved units above the neutral plane, and
   wherein one of the first pair of curved units and the second pair of curved units is configured to receive a tensile force and the other is configured to receive a compressive force when the flexible substrate is bent.

7. The display device according to claim 1, wherein the pair of curved units includes a first pair of curved units and a second pair of curved units, the display device further comprising:
   a first insulating layer between the first pair of curved units and the second pair of curved units with the second pair of curved units on an upper surface thereof; and
   a second insulating layer on the second pair of curved units and,
   the first insulating layer.

8. The display device according to claim 1, wherein the curved unit includes a first pair of curved units and a second pair of curved units, the display device further comprising:
   a first insulating layer on the first pair of curved units; and
   a second insulating layer on the second pair of curved units and having thickness different from that of the first insulating layer,
   wherein the first pair of curved units is on the bezel area at one side of the flexible substrate and the second pair of curved units is on the bezel area at an opposite side from the one side, and
   wherein the first pair of curved units and the second pair of curved units are on the same layer.

9. The display device according to claim 1, wherein the curved unit includes a first pair of curved units and a second pair of curved units, the display device further comprising:
   a first insulating layer on the bezel area at one side of the flexible substrate and on the bezel area at an opposite side from the one side, the first insulating layer being on the first pair of curved units at one side, and under the second pair of curved units at the other side; and
   a second insulating layer on the second pair of curved units at the other side,
   wherein the first pair of curved units and the second pair of curved units are on different layers.

10. The display device according to claim 1, wherein the bending sensor is located in a bending area at a central region of the display area of the flexible substrate that is foldable or located in the bending area that overlaps completely with the display area of the flexible substrate that is bendable.

11. The display device according to claim 1, wherein the bending area includes both a part of the bezel area and a part of the display area, or includes a part of the bezel area but not the display area.

12. The display device according to claim 1, wherein the bending sensor is configured to sense the electric change occurring in the pair of curved units, when the flexible substrate is bent, compares the electric change with an electric change value depending on a bending direction and a bending angle stored in a memory, and calculates a bending direction and a bending angle of the display device.

13. The display device according to claim 1, wherein the curved unit and the wiring part of the bending sensor is formed of a conductive material constituting a thin film transistor on the display area or a conductive material constituting a display element on the display area.

14. The display device according to claim 13, wherein the curved unit and the wiring part of the bending sensor is formed of the same material as a source electrode and a drain electrode of the thin film transistor.

15. A display device comprising:
   a flexible substrate having a pad area at a first edge thereof, the pad area having a first pad and a second pad adjacent thereto; and
   a bending sensor having a first single conductive path that begins from the first pad and ends at the second pad, the first single conductive path having a first portion extending along a second edge towards a third edge and having a second portion extending along the second edge back towards the first edge, the first and second portions being parallel to each other, the first portion including a first curved unit having a mesh-like wiring structure, and the second portion including a second curved unit having a mesh-like wiring structure, and the first and second curved units are located adjacent to each other in a bending area, and configured to provide changes in electrical characteristics due to bending of the flexible substrate at the bending area.

16. The display device according to claim 15, wherein the first and second curved units of the bending sensor are formed of the same material as a source electrode and a drain electrode of a thin film transistor in a display area of the flexible substrate.

17. The display device according to claim 16, wherein the bending area is at a central region of the display area of the flexible substrate that is foldable or the bending area overlaps completely with the display area of the flexible substrate that is bendable.

18. The display device according to claim 17, wherein the first and second curved units are arranged in a side-by-side manner or in a staggered manner.

19. The display device according to claim 18, wherein the bending sensor additionally has a second single conductive path having the same configuration as the first single conductive path but connected to a third pad and a fourth pad in the pad area, and the second single conductive path located above or below the first single conductive path with an insulation layer therebetween.

20. The display device according to claim 18, wherein the bending sensor additionally has a second single conductive path having the same configuration as the first single conductive path but connected to a third pad and a fourth pad in the pad area, and the second single conductive path located in a fourth edge that is opposite to the second edge.

* * * * *